(12) United States Patent
Miller

(10) Patent No.: US 8,086,111 B2
(45) Date of Patent: Dec. 27, 2011

(54) APPARATUS AND METHOD FOR CONTROLLING THE OPTICAL OUTPUT POWER OF A LASER IN AN OPTICAL TRANSMITTER (TX)

(75) Inventor: Frederick W. Miller, Santa Clara, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 404 days.

(21) Appl. No.: 12/419,232

(22) Filed: Apr. 6, 2009

(65) Prior Publication Data

US 2010/0254717 A1    Oct. 7, 2010

(51) Int. Cl.
*H04B 10/04* (2006.01)
*H04B 10/12* (2006.01)

(52) U.S. Cl. .......................................... 398/195; 398/197
(58) Field of Classification Search .................. 398/197, 398/195
See application file for complete search history.

(56) References Cited

U.S. PATENT DOCUMENTS

| | | | |
|---|---|---|---|
| 5,061,900 A | 10/1991 | Vinn et al. | |
| 5,548,435 A * | 8/1996 | Tahara et al. | 398/195 |
| 5,798,664 A | 8/1998 | Nagahori et al. | |
| 6,034,569 A | 3/2000 | Lan et al. | |
| 6,356,217 B1 | 3/2002 | Tilley et al. | |
| 6,710,645 B2 | 3/2004 | Isken et al. | |
| 6,897,700 B1 | 5/2005 | Fu et al. | |
| 6,937,083 B2 | 8/2005 | Manlove et al. | |
| 6,968,172 B2 | 11/2005 | Saito | |
| 7,181,146 B1 * | 2/2007 | Yorks | 398/195 |
| 7,259,616 B2 | 8/2007 | Chang | |
| 7,368,999 B2 | 5/2008 | Natzke | |
| 7,532,065 B2 | 5/2009 | Chen et al. | |
| 7,653,102 B2 * | 1/2010 | Miller | 372/38.07 |
| 7,755,421 B2 | 7/2010 | Chen et al. | |
| 7,881,608 B2 * | 2/2011 | Miller et al. | 398/25 |
| 7,924,088 B1 | 4/2011 | Chiang et al. | |
| 2003/0112049 A1 | 6/2003 | Wang | |
| 2003/0206054 A1 | 11/2003 | Jin | |
| 2004/0056181 A1 | 3/2004 | Ono | |
| 2004/0190914 A1 | 9/2004 | Kang et al. | |
| 2005/0232637 A1 | 10/2005 | Paillet et al. | |
| 2005/0258885 A1 | 11/2005 | Ono | |
| 2006/0045529 A1 | 3/2006 | Best | |
| 2006/0077003 A1 | 4/2006 | Chiu et al. | |
| 2006/0186954 A1 | 8/2006 | Koller et al. | |
| 2008/0007344 A1 | 1/2008 | Natzke | |
| 2008/0284522 A1 | 11/2008 | Denoyer | |
| 2009/0212856 A1 | 8/2009 | Chen et al. | |
| 2009/0302923 A1 | 12/2009 | Smeloy et al. | |

* cited by examiner

*Primary Examiner* — Kenneth N Vanderpuye
*Assistant Examiner* — Abbas H Alagheband

(57) ABSTRACT

A semi-open feedback loop optical output power control apparatus and method are provided for use in an optical TX. The apparatus and method enable input data signals having content frequencies that are below the cutoff frequency of the optical output power monitoring and control feedback loop to be utilized. This is accomplished at least in part by opening and closing (i.e., is disabling and enabling) the feedback loop based on whether or not one or more transitions in the input data signal to the optical TX from a logic 0 to a logic 1, or vice versa, are detected within a predetermined timing interval. In addition, the apparatus and method provide these and other advantages without causing the optical TX to have an increased link startup settling time period. The feedback loop has a low pass filter (LPF) that has a selectable bandwidth. The bandwidth of the LPF is set to a high bandwidth at startup to enable shorter link startup settling time periods to be achieved by the TX and is set to a low bandwidth at a later time to enable the feedback loop to cause more accurate adjustments to the optical output power of the laser to achieve a better bit error rate (BER).

18 Claims, 4 Drawing Sheets

APPARATUS AND METHOD FOR CONTROLLING THE OPTICAL OUTPUT POWER OF A LASER IN AN OPTICAL TRANSMITTER (TX)

TECHNICAL FIELD OF THE INVENTION

The invention relates to optical communications devices. More particularly, the invention relates to an optical output power control system for monitoring and adjusting the optical output power level of one or more lasers of an optical transmitter or optical transceiver.

BACKGROUND OF THE INVENTION

An optical transceiver module is an optical communications device used to transmit and receive optical data signals over optical waveguides (e.g., optical fibers) of an optical communications network. An optical transceiver module includes a transmitter (TX) portion and a receiver (RX) portion. The RX portion of an optical transceiver module typically includes one or more receive photodiodes for detecting optical data signals received over one or more optical fibers and for producing corresponding electrical signals. Electrical circuitry of the RX portion detects and processes the electrical signals produced by the receive photodiodes to recover the data contained in the received optical data signals.

The TX portion of an optical transceiver module includes input circuitry, a laser driver circuit, one or more laser diodes, and an optics system. The input circuitry typically includes buffers and amplifiers for conditioning an input data signal, which is then provided to the laser driver circuit. The laser driver circuit receives the conditioned input data signal and produces electrical modulation and bias current signals, which are provided to the laser diodes to cause them to produce optical data signals having logic 1 and logic 0 intensity levels corresponding to the electrical bits contained in the input data signal. The optical data signals are then directed by the optics system of the TX portion onto the ends of respective transmit optical fibers held within a connector that mates with the optical transceiver module.

The TX portion of an optical transceiver module typically also includes an open loop or closed loop optical output power control system that monitors and controls the modulation and/or bias currents of the laser diodes in such a way that the average optical output power levels of the laser diodes are maintained at substantially constant levels. Open loop optical output power control systems do not directly measure the optical output power levels of the laser diodes, but rather, rely on temperature, age and/or other parameters to determine adjustments that need to be made to the bias and/or modulation currents of the laser diodes to maintain their average optical output power levels at substantially constant average optical output power levels. Closed loop optical output power control systems use monitor photodiodes in the TX portion to monitor the output power levels of the laser diodes and feedback circuitry to produce control signals that are then used to adjust the modulation and/or bias currents of the laser diodes such that their average optical output power levels are maintained at substantially constant levels. Closed loop optical output power control systems are generally more accurate than open loop optical output power control systems due to the fact that closed loop systems react in real time based on real time measurements to make the necessary adjustments to the modulation and/or bias currents of the laser diodes.

FIG. 1 illustrates a block diagram of a typical TX portion 21 of an optical transmitter or transceiver module that includes a closed loop optical output power control system. The TX portion 21 includes a buffer 31, a pre-drive amplifier 32, a laser driver circuit 33, and a laser diode 34. The TX portion 21 typically also includes an optics system (not shown) for directing the light produced by the laser diode 34 onto the end of a transmit optical fiber (not shown). For ease of illustration, the optics system of the TX portion 21 is not shown in FIG. 1. The buffer 31 receives an input data signal at its input and adds some gain to the input data signal. The pre-drive amplifier 32 adds some additional gain to the input data signal and provides an output signal to the laser driver circuit 33. The laser driver circuit 33 provides a modulation current and a bias current to the laser diode 34 based on the amplified input data signal output from the pre-drive amplifier 33 that cause the laser diode 34 to produce optical output signals having logic 0 and logic 1 power levels that represent the logic 0 and logic 1 electrical bits, respectively, contained in the input data signal.

The closed loop optical output power control system of the TX portion 21 comprises a optical output power feedback control loop made up of a monitor photodiode 22, a transimpedance amplifier (TIA) 23, a low pass filter (LPF) 24, a power monitoring circuit (PMC) 25, an analog-to-digital converter (ADC) 26, and a controller device 27. The monitor photodiode 22 detects the optical data signals produced by the laser diode 34 and produces corresponding electrical current signals. The TIA 23 detects the electrical current signals produced by the photodiode 22 and produces an output voltage signal, which is integrated by the LPF 24 to produce an average voltage level. The PMC 25 receives the average voltage level produced by the LPF 24 and outputs an analog voltage level value indicative of the average optical output power level of the laser diode 34. The analog power level value is input to the ADC 26, which converts the analog value into a digital value and provides the digital value to the controller device 27.

The controller device 27 is configured to perform various algorithms to control the TX portion 21. One of these algorithms uses the digital value representing the average optical output power level of the laser diode 34 to produce one or more laser control signals, which are delivered to the laser driver circuit 33. The laser control signals are adjusted by the controller device 27 based on the digital value corresponding to the detected average optical output power level value received by the controller device 27 from the ADC 26. These adjustments cause the laser driver circuit 33 to adjust the bias and/or modulation currents of the laser diode 34 such that the average optical output power level of the laser diode 34 is maintained at a substantially constant level. The controller device 27 also produces an Enable signal that can be used to enable/disable the laser diode 34 based on a control algorithm, external signal, or fault monitoring circuits (not shown).

The optical output power monitoring feedback loop of the TX portion 21 has a low cutoff frequency due to the frequency response of the LPF 24. This low cutoff frequency limits the frequency content that the input data signal to the TX portion 21 can have. For example, if the input data signal comprises a long string of consecutive logic 1s or logic 0s, this frequency of such a pattern may be below cutoff frequency of the feedback loop, resulting in the feedback loop causing improper adjustments to be made to the modulation and/or bias currents of the laser diode 34. Consequently, the feedback loop will not be effective at maintaining a constant average optical output power level for the laser diode 34 when the frequency content of the input data signal drops below the low frequency cutoff of the feedback loop.

One way to extend the lengths of the strings of consecutive logic 1s or logic 0s that can be handled by the TX portion 21 is to lower the cutoff frequency of the feedback loop. The typical method to reduce the low frequency cutoff of the feedback loop involves using larger circuit elements in the feedback loop circuitry. However, such solutions have the undesired impact of larger circuit elements that tend to increase die area and costs.

Another problem associated with attempting to lower the cutoff frequency of the feedback loop is that doing so increases the link startup time period of the TX portion 21. The LPF 24 of the feedback loop integrates the output of the TIA 23 to obtain an average value. The TX startup time period is generally determined by the amount of time that is required for the LPF 24 to converge to its steady state. Lowering the cutoff frequency of the LPF 24 increases the amount of time that is required for the LPF 24 to converge to its steady state. Industry or customer constraints place an upper limit on how long the link startup time period can be, which, in turn, places a lower limit on the cutoff frequency of the LPF 24.

Accordingly, a need exists for an optical TX having an optical output power control system and method that provide accurate results when the optical TX is transmitting relatively long patterns of consecutive logic 1s or consecutive logic 0s. A need also exists for such an optical output power control system that provides these advantages without increasing the startup settling time period of the optical TX.

SUMMARY OF THE INVENTION

The invention is directed to a method and apparatus for use in an optical TX for controlling an optical output power level of at least one laser of the optical TX. The apparatus comprises a signal transition detection (XD) circuit, an optical output power monitoring feedback loop, and a controller device. The signal XD circuit is electrically coupled to input circuitry of the optical TX. The signal XD circuit detects whether an input data signal to the optical TX has transitioned from a logic 0 to a logic 1, or vice versa, within a predetermined timing interval and produces an XD output signal. The optical output power monitoring feedback loop comprises at least one monitor photodetector, an electrical detection circuit, a bandwidth-selectable (BW-S) low pass filter (LPF), a power monitoring circuit (PMC), and a controller device. The monitor photodetector receives at least a portion of an optical output signal produced by its corresponding laser of the optical TX and produces an electrical monitor signal based on the optical output signal. The electrical detection circuit receives the electrical monitor signal produced by the monitor photodetector and produces an electrical detection signal based on the electrical monitor signal. The BW-S LPF receives the electrical detection signal produced by the electrical detection circuit and filters the electrical detection signal to produce an electrical filtered signal. The PMC receives the electrical filtered signal produced by the BW-S LPF and produces an electrical average power signal based on the electrical filtered signal. The electrical average power signal corresponds to a measure of an average optical output power level of the optical output signal produced by the laser. The controller device is configured to perform an optical output power control system (OPCS) algorithm that controls the optical output power level of the laser based at least in part on the electrical average power signal produced by the PMC and on the XD output signal produced by the signal XD circuit.

The method comprises the following. In a signal XD circuit of the optical TX, detecting whether an input data signal to the optical TX has transitioned from a logic 0 to a logic 1, or vice versa, within a predetermined timing interval and producing an XD output signal. The method further comprises, in an optical output power monitoring feedback loop comprising at least one monitor photodetector, an electrical detection circuit, a BW-S LPF, a PMC, and a controller device, receiving at least a portion of an optical output signal produced by its corresponding laser of the optical TX with the monitor photodetector and producing an electrical monitor signal at an output of the monitor photodetector based on the optical output signal produced by the laser. The method further comprises receiving the electrical monitor signal with the electrical detection circuit and producing an electrical detection signal based on the electrical monitor signal. The method further comprises filtering the electrical detection signal in the BW-S LPF to produce an electrical filtered signal. The method further comprises receiving the electrical filtered signal in the PMC and producing an electrical average power signal based on the electrical filtered signal. The electrical average power signal corresponds to a measure of the average optical output power level of the optical output signal produced by the laser. The method further comprises receiving the electrical average power signal and the XD output signal in the controller device and performing an optical output power control system (OPCS) algorithm in the controller device that controls the optical output power level of the laser based at least in part on the electrical average power signal and on the XD output signal.

These and other features and advantages of the invention will become apparent from the following description, drawings and claims.

DETAILED DESCRIPTION OF AN ILLUSTRATIVE EMBODIMENT

In accordance with the invention, a semi-open feedback loop optical output power control system and method are provided for use in an optical TX. The system and method enable input data signals having content frequencies that are below the cutoff frequency of the feedback loop to be utilized. In addition, the system and method provide these and other advantages without causing the optical TX to have an increased link startup settling time period. The semi-open feedback loop optical output power control system is opened and closed (i.e., is disabled and enabled) based on whether or not one or more transitions in the input data signal to the optical TX are detected within a predetermined timing interval. In addition, the bandwidth (BW) of the LPF of the feedback loop is adjustable to enable shorter link startup settling time periods to be achieved by the TX.

The system and method may be incorporated into a TX portion of an optical transceiver that also has an RX portion, or into a stand-alone optical TX. The optical transceiver or stand-alone optical TX in which the system and method are incorporated may have a single TX channel that uses a single laser diode to produce an optical data signal and a single monitor photodiode to monitor the optical output power level of the laser diode. Alternatively, the optical transceiver or stand-alone optical TX in which the system and method are incorporated may have a multiple TX channels that use multiple laser diodes to produce multiple optical data signals, and multiple monitor photodiodes to monitor the respective optical output power levels of the respective laser diodes. For ease of illustration and discussion, it will be assumed that the optical transceiver or the stand-alone optical TX in which the system and method are incorporated has a single laser diode and a single monitor photodiode. Those of ordinary skill in the art will understand, in view of the description provided herein, the manner in which the system and method described herein may be incorporated into an optical transceiver that has multiple transmit channels or a stand-alone optical TX that has multiple transmit channels. The term "optical TX", as that term is used herein, is intended to denote either a stand-alone optical TX that incorporates the system and method or an optical transceiver that incorporates the system and method, either of which may have a single laser diode and a single monitor photodiode or multiple laser diodes and multiple monitor photodiodes.

Figure 2:
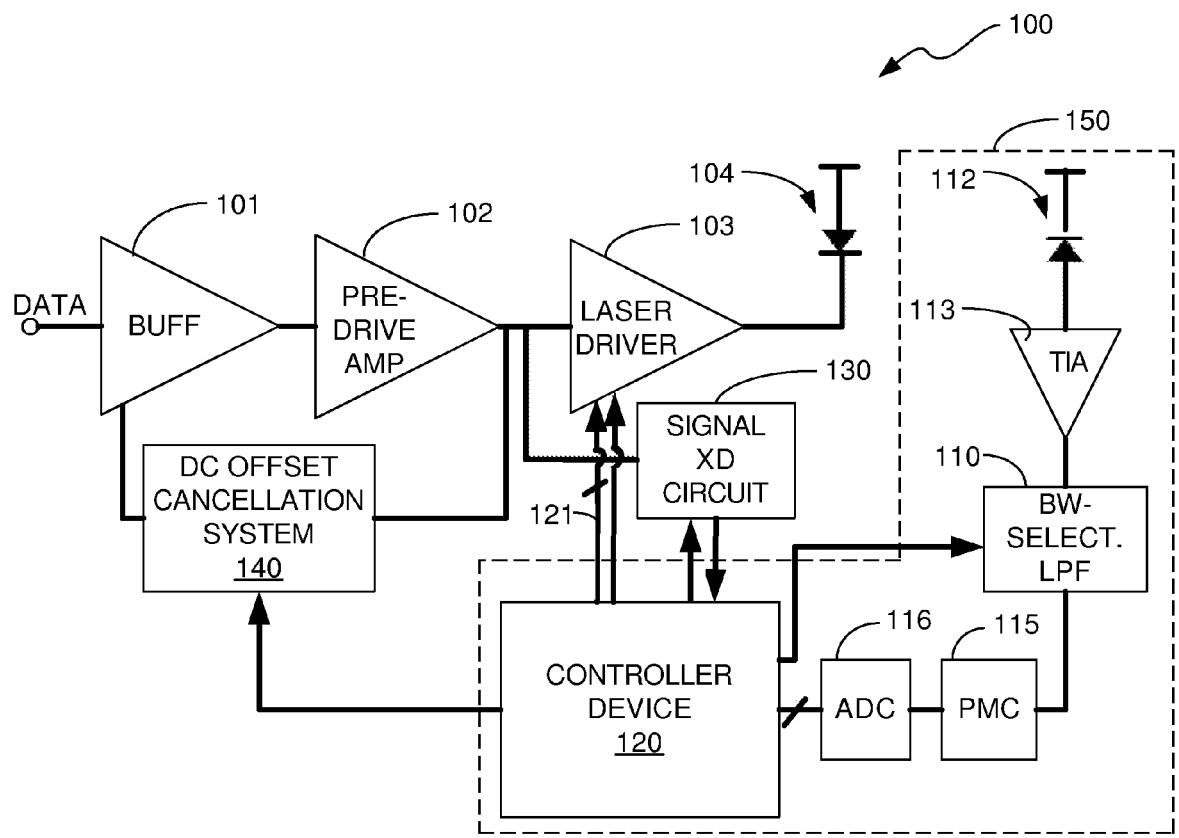
FIG. 2 illustrates a block diagram of an optical TX having a semi-open loop optical output power control system in accordance with an illustrative embodiment of the invention.

FIG. 2 illustrates a block diagram of an optical TX 100 that has a semi-open optical output power control system in accordance with an embodiment of the invention for monitoring and adjusting the optical output power level of the laser diode. The optical TX 100 includes a buffer 101, a pre-drive circuit 102, a laser driver circuit 103, and a laser diode 104. The optical TX 100 typically also includes an optics system (not shown) for directing the light produced by the laser diode 104 onto the end of a transmit optical fiber (not shown). For ease of illustration, the optics system of the optical TX 100 is not shown in FIG. 2. The buffer 101 receives an input data signal at its input and adds some gain to the input data signal. The pre-drive circuit 102 adds some additional gain to the data signal and provides an output signal to the laser driver circuit 103. The laser driver circuit 103 provides a modulation current and a bias current to the laser diode 104 that cause the laser diode 104 to produce optical output signals having logic 0 and logic 1 power levels that represent the logic 0 and logic 1 bits, respectively, contained in the input data signal received at the input of the buffer 101.

The optical output power control apparatus of the optical TX 100 comprises a semi-open optical output power monitoring and control feedback loop 150 made up of a monitor photodetector 112, a TIA 113, a bandwidth-selectable (BW-S) LPF 110, a power monitoring circuit (PMC) 115, an ADC 116, and a controller device 120. The controller device 120 uses the feedback from the feedback loop 150 to generate one or more laser control signals, which are provided to the laser driver circuit 103. These laser control signals, which are represented by signal line 121 cause the laser driver circuit 103 to adjust the one or more laser currents (e.g., the modulation and/or bias currents) of the laser diode 104, which, in turn, causes the laser diode 104 to adjust its optical output power level such that its average optical output power level is maintained at a substantially fixed predetermined level. Typically, one of the laser control signals causes the laser driver circuit 103 to adjust the modulation current of the laser diode 104 and another one of the laser control signals causes the laser driver circuit 103 to adjust the bias current of the laser diode 104.

A signal transition detection (XD) circuit 130 that is external to the feedback loop 150 detects whether one or more signal transitions in the amplified input data signal output from the pre-drive amplifier 102 have occurred within a predetermined timing interval. The monitor photodetector 112, which is typically a photodiode 112, detects the optical signals produced by the laser diode 104 and produces corresponding electrical current signals. The TIA 113 detects the electrical current signals produced by the photodiode 112 and produces an output voltage signal, which is integrated by the bandwidth-selectable (BW-S) LPF 110 to produce an average voltage level. The PMC 115 receives the average voltage level produced by the BW-S LPF 110 and outputs an analog voltage level value indicative of the average optical output power level of the laser diode 104, as detected by the monitor photodiode 112. This analog value is input to the ADC 116, which converts it into a respective digital value and provides the digital value to the controller device 120.

The controller device 120 is configured to perform one or more algorithms to control the optical TX 100, including an optical output power control system (OPCS) algorithm. The OPCS algorithm uses the digital value received from the ADC 116 representing the average optical output power level of the laser diode 104 to produce the one or more laser control signals that are delivered on lines(s) 121 to the laser driver circuit 103. As indicated above, the OPCS algorithm adjusts these laser control signals based on the digital value received by the controller device 120 from the ADC 116. As indicated above, these adjustments cause the laser driver circuit 103 to adjust the bias and/or modulation currents of the laser diode 104 such that the average optical output power level of the laser diode 104 is maintained at a substantially constant, predetermined level.

In accordance with an embodiment, the OPCS algorithm also provides enable and disable signals to the laser driver circuit 103 and the signal XD circuit 130 to turn on and off electrical power to these circuits. The OPCS algorithm uses the information regarding signal transitions provided by the signal XD circuit 130 to control the closing and opening of the feedback loop 150 and to turn on and off electrical power to the laser driver circuit 103 and the signal XD circuit 130. The opening and closing of the feedback loop 150 can be accomplished in a number of ways. For example, one way to "open" the feedback loop 150 is simply to prevent the laser control signals provided on lines 121 from the controller device 120 to the laser driver circuit 103 from being updated, i.e., from being adjusted by the OPCS algorithm. If this technique is used, then the feedback loop 150 is "closed" by allowing the laser control signals provided on lines 121 from the controller device 120 to the laser driver circuit 103 to be updated, or adjusted, by the OPCS algorithm. Another technique for opening and closing the feedback loop 150 is to physically open and close circuits in the path that is used to control the modulation and/or bias currents of the laser diode 104, which may accomplished in a variety of ways. Therefore, any reference herein to opening the feedback loop 150 and closing the feedback loop 150 should be construed herein as being accomplished by using any of the aforementioned techniques and configurations to prevent the modulation and/or bias currents of the laser diode 104 from being adjusted based on feedback from the feedback loop 150.

The OPCS algorithm also provides a BW select signal to the BW-S LPF 110 to cause the BW-S LPF 110 to select a particular BW. The OPCS algorithm will be described below in greater detail with reference to FIGS. 3 and 4. Generally, the BW of the BW-S LPF 110 is set to a high BW at startup when the TX 100 is powered on and is subsequently set to a low BW at a later time. Setting the BW of the BW-S LPF 110 to a high BW at startup, enables the feedback loop 150 to settle to its steady state condition very rapidly, which decreases the link startup time period.

It should be noted that FIG. 2 illustrates one of many possible configurations for the semi-open feedback loop optical output power control system. For example, the TIA 113 is merely one example of electrical detection circuitry that may be used to detect the electrical signal output by the monitor photodetector 112. Those of ordinary skill in the art will understand that other circuits may be used for this purpose. Also, a photodetector other than a photodiode may be used as the monitor photodetector 112. The photodetector 112 may be any suitable optical detector. Also, while the ADC 116 is shown in FIG. 2 as being external to the controller device 120, the ADC 116 may be part of the controller device 110. The controller device 120 typically comprises one or more state machines and combinational logic gates that are integrated into the TX IC. The ADC 116 may be integrated along with the controller device 120 into the TX IC.

Figure 1:
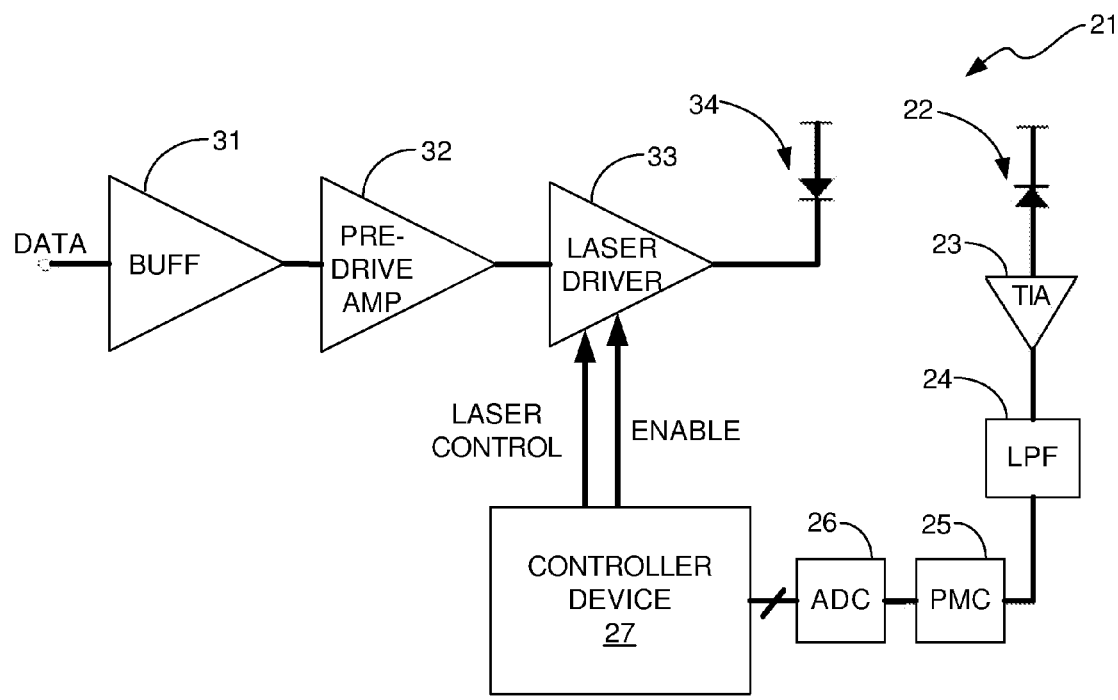
FIG. 1 illustrates a block diagram of a TX portion of a typical optical transmitter or optical transceiver module.
Figure 3:
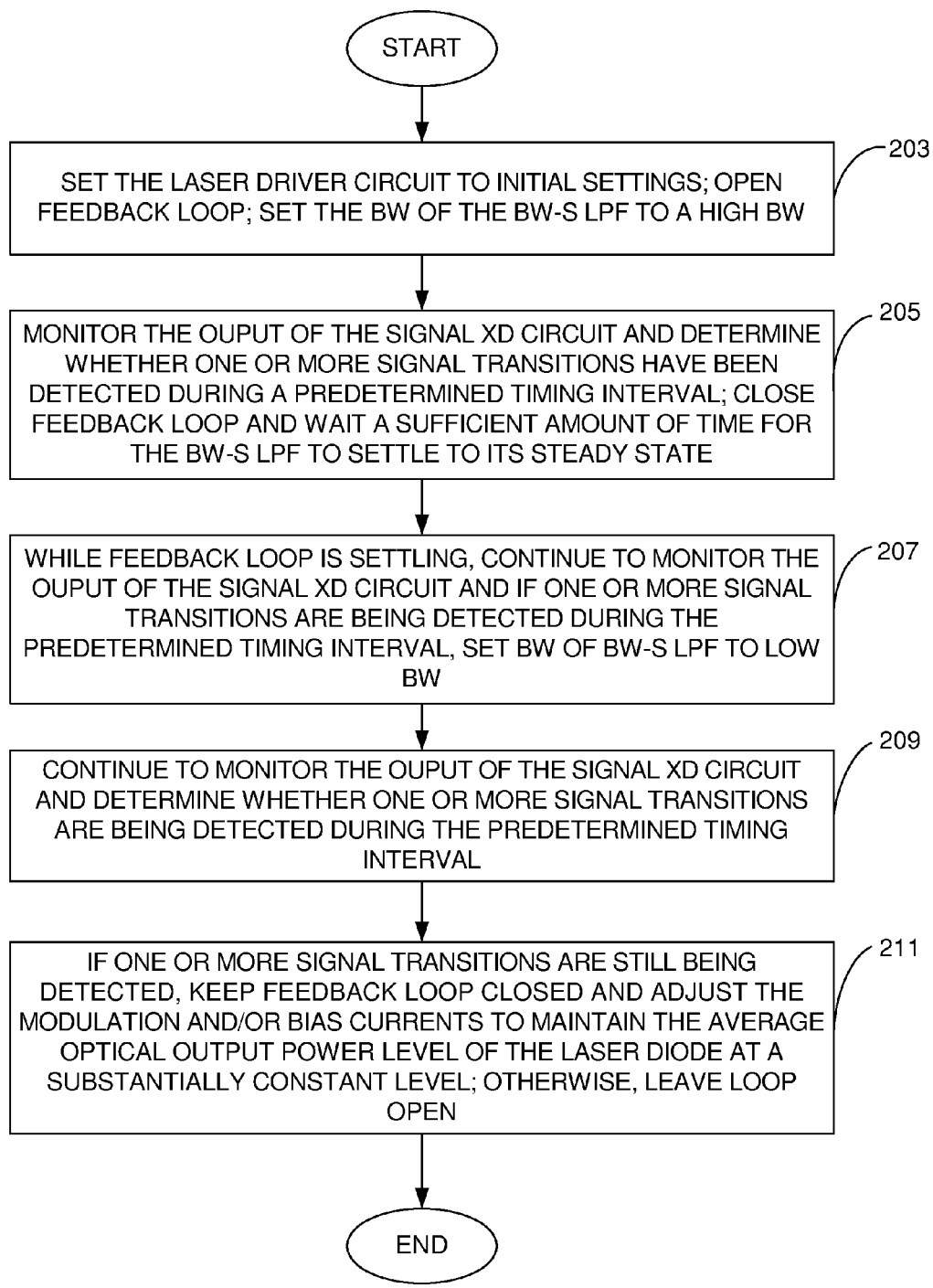
FIG. 3 illustrates a flowchart that represents the semi-open loop optical output power control method in accordance with an illustrative embodiment.

FIG. 3 illustrates a flowchart that represents the method performed by the TX in accordance with one illustrative embodiment. For illustrative purposes, the flowchart of FIG. 3 will be described with reference to the TX 100 shown in FIG. 2. At startup (block 203), the laser driver circuit 103 is set to initial settings, the feedback loop 150 is open, the BW of the BW-S LPF 110 is set to a high BW, and the BW-S LPF. Setting the laser driver circuit 103 to the initial settings causes the modulation and bias currents of the laser diode 104 to be set to their initial settings. Opening the feedback loop 150 ensures that the modulation and/or bias current settings will not be updated, or adjusted. Setting the BW-S LPF 110 to the high BW at startup allows the LPF 110 to converge (once data transitions are received) to its steady state more rapidly than if the LPF 110 is set to its normal low bandwidth at startup. This rapid convergence of the LPF 110 to steady state provides a reduced link startup settling time period for the feedback loop 150 compared to that with the LPF 24 shown in FIG. 1. This reduced settling time period helps ensure that the TX 100 will meet link startup settling time limits. In addition, this feature is especially advantageous in situations where the TX 100 is used for burst data mode operations in which the TX 100 is powered down when data is not being received to conserve power.

At block 205, the controller device 120 begins monitoring the output of the signal XD circuit 130 and determines whether one or more signal transitions have been detected during a predetermined timing interval. If a determination is made that one or more signal transitions have been detected during the predetermined timing interval, then the controller device 120 closes the feedback loop 150 such that the controller device 120 begins monitoring the optical output power level of the laser diode 104 and adjusting, or updating, the laser control signals 121 that cause the laser driver circuit 103 to adjust the modulation and/or bias currents of the laser diode 104 such that the average optical output power level of the laser diode 104 is maintained at a substantially constant level. The controller device 120 continues to monitor the output signal output from the signal XD circuit 130 while the time is allowed for the loop 150 to settle, as indicated by block 207. At block 207, if signal transitions are still being detected, then the LPF 110 is switch to low BW.

The process then proceeds to block 209. At block 209, the controller device 120 continues to monitor the output signal output from the signal XD circuit 130 while the loop 150 is settling. From block 209, the process proceeds to block 211. At block 211, if the controller device 120 determines that signal transitions are not still being detected, then the controller device 120 leaves the feedback loop 150 in the open state so that the modulation and/or bias currents of the laser diode 104 are not updated. If at block 211 the controller device 120 determines that signal transitions are still being detected, then the controller device 120 closes the feedback loop 150 so that the modulation and/or bias currents of the laser diode 104 are updated.

Figure 4:
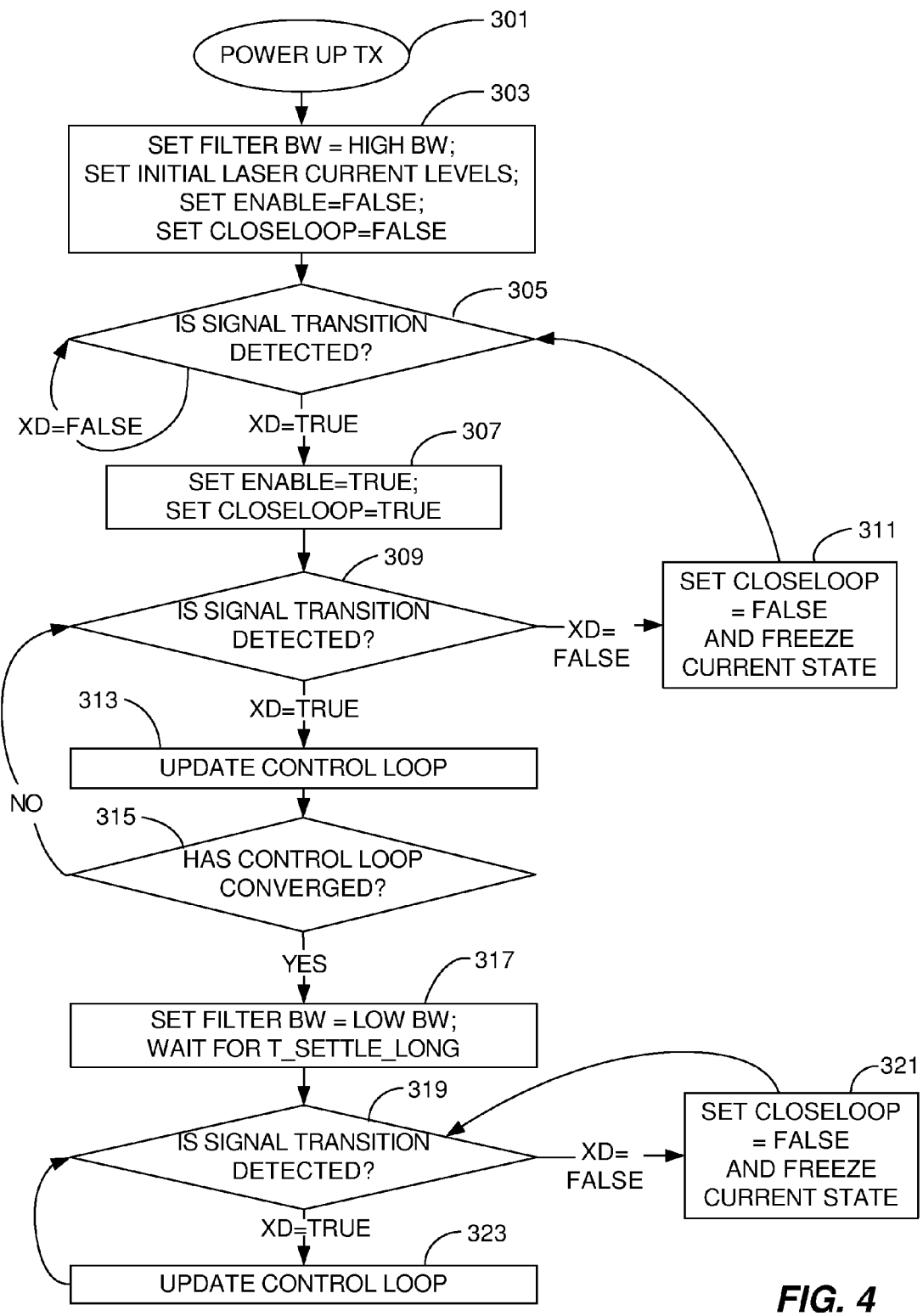
FIG. 4 illustrates a state diagram that demonstrates a detailed example of the manner in which the optical TX shown in FIG. 2 operates in accordance with an embodiment to perform the semi-open loop optical output power control method.

Many variations can be made to the method described above with reference to FIG. 3, such as, for example, adding steps that can be used to save electrical power. FIG. 4 illustrates a state diagram that demonstrates a detailed example of the manner in which the TX 100 operates to perform the method in accordance with another embodiment. Starting at power up, which is represented by block 301 in FIG. 4, the TX 100 enters the state represented by block 303 in which the laser driver circuit 103 and the signal XD circuit 130 are inactive. In the state represented by block 303, the BW of the BW-S LPF 110 is set to a high BW, the current levels of the laser driver circuit 103 are set to initial current level settings, the laser driver circuit 103 and the signal XD circuit 130 are turned off (by setting the "Enable" signal equal to False), and the feedback loop 150 is opened (by setting CloseLoop equal to False). As indicated above, setting the BW of the BW-S LPF 110 to the high BW provides the BW-S LPF 110 with a short settling time when the TX 100 is powered up, which reduces the startup settling time period of the TX 100.

The TX 100 then enters the state represented by block 305. In this state, the controller device 120 monitors the output of the signal XD circuit 130 and determines whether one or more signal transitions are detected within a predetermined timing interval. Once the controller device 120 determines that one or more signal transitions are being detected (i.e., the input signal labeled "Data" is transitioning between logic 1 and logic 0 levels) within the predetermined timing interval, the controller device 120 causes the TX 100 to enter the state represented by block 307, in which it sets Enable and CloseLoop equal to True. Setting Enable equal to True enables the laser driver circuit 103. Setting CloseLoop equal to True closes the feedback loop 150.

The TX 100 then enters the state represented by block 309 in which the controller device 120 continues to monitor the output of the signal XD circuit 130 to determine whether one or more signal transitions are still being detected within the predetermined timing interval. If one or more signal transitions are not still being detected, XD is set equal to False and the TX 100 enters the state represented by block 311. In the state represented by block 311, CloseLoop is set equal to false and the current state of the TX 100 is frozen, i.e., saved in a memory device (not shown). The memory device that is used to save the state of the TX 100 may be internal to or external to the controller device 120. The TX 100 then re-enters the state represented by block 305.

If one or more signal transitions are still detected when the TX 100 is in the state represented by block 309, (indicated by XD being equal to True) then the TX 100 enters the state represented by block 313. In this state, the control loop is updated, which means that the controller device 120 begins using the feedback signal output from the ADC 116 to adjust the laser control signals delivered by the controller device 120 to the laser driver circuit 103 to cause the laser driver circuit 103 to adjust the bias and/or modulation currents of the laser diode 104 in a manner that causes the average optical output power level of the laser diode 104 to be maintained at a pre-selected substantially constant level.

While the control loop is being updated, the TX 100 enters the state represented by block 315. In this state, the controller device 120 determines whether or not the feedback loop 150 has converged, i.e., whether the average optical output power level of the laser diode 104 is currently at its predetermined, substantially constant level. If not, the TX 100 re-enters the state represented by block 309. Otherwise, if convergence of the feedback loop 150 is verified by the controller device 120 in the state represented by block 315, the TX 100 enters the state represented by block 317. In this state, the BW of the BW-S LPF 110 is set to its low BW and the controller device 120 then waits for a long settling time period, T_Settle_Long, to pass to allow the BW-S LPF 110 to settle to its steady state condition at the low BW.

The TX 100 then enters the state represented by block 319. In this state, the controller device 120 continues to monitor the output of the signal XD circuit 130 to determine whether or not signal transitions are still being detected within the predetermined timing interval. If not, the TX 100 enters the state represented by block 321 in which CloseLoop is set equal to False and the current state of the TX 100 is frozen, i.e., saved in memory. From the state represented by block 321, the TX 100 re-enters the state represented by block 319. If in the state represented by block 319, the controller device 120 determines that signal transitions are still being detected by the signal XD circuit 130, the TX 100 enters the state represented by block 323 in which the controller device 120 causes the laser control signals being delivered to the laser driver circuit 103 by the controller device 120 to be adjusted to the extent necessary to cause the bias and/or modulation currents of the laser diode 104 to be adjusted such that the average optical output power level of the laser diode 104 is at its predetermined, substantially constant level. From the state represented by block 323, the TX 100 re-enters the state represented by block 319 in which the controller device 120 continues to monitor the output of the signal XD circuit 130 to determine whether or not signal transitions are still being detected.

Blocks 305, 309 and 319 in FIG. 4 correspond to states in which the controller device 120 determines whether one or more signal transitions have occurred during the predetermined time period. If signal transitions are not detected during the predetermined timing interval, then the controller device 120 opens the feedback loop 150 so that the bias and/or modulation currents of the laser diode 104 are not adjusted. Consequently, when a determination is made that one or more signal transitions have not occurred during the predetermined timing interval, no adjustments are made to the bias and/or modulation currents until the controller device 120 subsequently determines that one or more signal transitions have been detected during the aforementioned predetermined timing interval.

The BW of the BW-S LPF 110 determines the maximum run length of data that can be properly processed by the feedback loop 150 when it is in the closed state. Thus, in the state represented by block 303, setting the BW of the BW-S LPF 110 to the high BW will allow shorter run lengths of data to be handled when the loop 150 is subsequently closed in the state represented by block 307 than would be possible if the BW of the LPF 110 were to be set to a low BW immediately after powering up the TX 100. However, a much shorter initial settling time period is achieved, after which the BW of the LPF 110 is reduced, allowing less data sensitivity and longer run lengths to be achieved. However when the loop is opened, the run lengths that can be tolerated are significantly longer and could be extended indefinitely in the absence of input power drift, temperature drift and other factors. These drifts due to temperature changes, voltage changes, device leakage and other factors will limit how long a run length that can ultimately be handled by the system while operating in the open loop condition. When data transitions are present, the loop 150 is operated in the closed loop mode, whereas while data transitions are absent, the loop 150 is operated in the opened loop mode. Operating the loop 150 in this manner, combines the benefits of closed loop power control with the data pattern (and frequency) insensitivity of open loop power control.

It should be noted that the invention has been described with respect to illustrative embodiments for the purpose of describing the principles and concepts of the invention. The invention is not limited to these embodiments. For example, while the invention has been described with reference to using a particular optical TX configuration, the invention is not limited to this particular configuration. Also, the state diagram shown in FIG. 4 is merely one example of the manner in which the TX may operate. The invention is not limited to the particular embodiments represented by these state diagrams. As will be understood by those skilled in the art in view of the description being provided herein, many modifications may be made to the embodiments described herein without deviating from the goals of the invention, and all such modifications are within the scope of the invention.

What is claimed is:

1. An apparatus for use in an optical transmitter (TX) for controlling an optical output power level of at least one laser of the optical TX, the apparatus comprising:

a signal transition detection (XD) circuit electrically coupled to input circuitry of the optical TX, the signal XD circuit detecting whether an input data signal to the optical TX has transitioned from a logic 0 to a logic 1, or vice versa, within a predetermined timing interval and producing an XD output signal; and an optical output power monitoring feedback loop, the feedback loop comprising:

at least one monitor photodetector, the photodetector receiving at least a portion of an optical output signal produced by a corresponding laser of the optical TX and producing an electrical monitor signal based on the optical output signal;

an electrical detection circuit configured to receive the electrical monitor signal produced by the monitor photodetector and to produce an electrical detection signal based on the electrical monitor signal;

a bandwidth-selectable (BW-S) lowpass filter (LPF) configured to receive the electrical detection signal produced by the electrical detection circuit and to filter the electrical detection signal to produce an electrical filtered signal;

a power monitoring circuit (PMC) configured to receive the electrical filtered signal produced by the BW-S LPF and to produce an electrical average power signal based on the electrical filtered signal, the electrical average power signal corresponding to a measure of an average optical output power level of the optical output signal produced by the laser; and a controller device electrically coupled to the PMC and to the signal XD circuit, the controller device being configured to perform an optical output power control system (OPCS) algorithm that controls the optical output power level of the laser based at least in part on the electrical average power signal produced by the PMC and on the XD output signal produced by the signal XD circuit.

2. The apparatus of claim 1, wherein the OPCS algorithm controls the optical output power level of the laser by adjusting one or more laser control signals that are output from the controller device to a laser driver circuit of the optical TX to cause the laser driver circuit to adjust one or more electrical currents of the laser such that an average optical output power level of the laser is adjusted, wherein if the feedback loop is opened, one or more electrical currents of the laser are prevented from being adjusted, and wherein if the feedback loop is closed, the one or more electrical currents of the laser are allowed to be adjusted, and wherein prior to adjusting the one or more electrical currents, the OPCS algorithm determines whether the XD output signal indicates that the input data signal has a first status or a second status, wherein if the OPCS algorithm determines that the input data signal has the first status, the OPCS algorithm causes the feedback loop to be opened such that the one or more electrical currents of the laser are prevented from being adjusted, and wherein if the OPCS algorithm determines that the input data signal has the second status, the OPCS algorithm causes the feedback loop to be closed such that the one or more electrical currents of the laser are allowed to be adjusted.

3. The apparatus of claim 2, wherein the OPCS algorithm determines that the XD output signal indicates that the input data signal has a first status if the XD output signal indicates that one or more transitions in the input data signal from a logic 1 to a logic 0, or vice versa, have not occurred during a predetermined timing interval, and wherein the OPCS algorithm determines that the XD output signal indicates that the input data signal has a second status if the XD output signal indicates that one or more transitions in the input data signal from a logic 1 to a logic 0, or vice versa, have occurred during a predetermined timing interval.

4. The apparatus of claim 3, wherein the feedback loop is opened at startup of the optical TX when the optical TX is powered on.

5. The apparatus of claim 4, wherein the OPCS algorithm causes a BW of the BW-S LPF to be set to a high BW at startup of the optical TX when the optical TX is powered on.

6. The apparatus of claim 5, wherein after the BW of the BW-S LPF has been set to the high BW, the feedback loop is closed if the OPCS algorithm determines that the input data signal has the second status and is left open if the input data signal has the second status.

7. The apparatus of claim 6, wherein if the feedback loop is closed, the feedback loop is allowed to settle to a steady state condition, wherein after the feedback loop has settled to the steady state condition, the OPCS algorithm checks whether the input data signal still has the second status, and if so, causes the BW of the BW-S LPF to be set to a low BW.

8. The apparatus of claim 7, wherein after the feedback loop has settled to the steady state condition, the OPCS algorithm again determines whether the input data signal has the first or second status, wherein if the OPCS algorithm again determines that the input data signal has the second status, the OPCS algorithm causes the feedback loop to be kept closed.

9. The apparatus of claim 8, wherein if, after the feedback loop is closed, the OPCS algorithm determines that the input data signal has the first status, the feedback loop is opened.

10. A method for controlling an optical output power level of at least one laser of an optical transmitter (TX), the method comprising:

in a signal transition detection (XD) circuit of the optical TX, detecting whether an input data signal to the optical TX has transitioned from a logic 0 to a logic 1, or vice versa, within a predetermined timing interval and producing an XD output signal; and in an optical output power monitoring feedback loop comprising at least one monitor photodetector, an electrical detection circuit, a bandwidth-selectable (BW-S) lowpass filter (LPF), a power monitoring circuit (PMC), and a controller device:

receiving at least a portion of an optical output signal produced by a corresponding laser of the optical TX with the monitor photodetector and producing an electrical monitor signal at an output of the monitor photodetector based on the optical output signal produced by the corresponding laser;

receiving the electrical monitor signal with the electrical detection circuit and producing an electrical detection signal based on the electrical monitor signal;

filtering the electrical detection signal in the BW-S LPF to produce an electrical filtered signal;

receiving the electrical filtered signal in the PMC and producing an electrical average power signal based on the electrical filtered signal, the electrical average power signal corresponding to a measure of an average optical output power level of the optical output signal produced by the laser; and receiving the electrical average power signal and the XD output signal in the controller device and performing an optical output power control system (OPCS) algorithm in the controller device that controls the optical output power level of the laser based at least in part on the electrical average power signal and on the XD output signal.

11. The method of claim 10, wherein the OPCS algorithm controls the optical output power level of the laser by adjusting one or more laser control signals that are output from the controller device to a laser driver circuit of the optical TX to cause the laser driver circuit to adjust one or more electrical currents of the laser to be adjusted such that an average optical output power level of the laser is adjusted, wherein if the feedback loop is opened, the one or more electrical currents of the laser are prevented from being adjusted, and wherein if the feedback loop is closed, the one or more electrical currents of the laser are allowed to be adjusted, and wherein prior to adjusting the one or more electrical currents of the laser, the OPCS algorithm determines whether the XD output signal indicates that the input data signal has a first status or a second status, wherein if the OPCS algorithm determines that the input data signal has the first status, the OPCS algorithm causes the feedback loop to be opened such that the one or more electrical currents of the laser are prevented from being adjusted, and wherein if the OPCS algorithm determines that the input data signal has the second status, the OPCS algorithm causes the feedback loop to be closed such that the one or more electrical currents of the laser are allowed to be adjusted.

12. The method of claim 11, wherein the OPCS algorithm determines that the XD output signal indicates that the input data signal has a first status if the XD output signal indicates that one or more transitions in the input data signal from a logic 1 to a logic 0, or vice versa, have not occurred during a predetermined timing interval, and wherein the OPCS algorithm determines that the XD output signal indicates that the input data signal has a second status if the XD output signal indicates that one or more transitions in the input data signal from a logic 1 to a logic 0, or vice versa, have occurred during a predetermined timing interval.

13. The method of claim 12, wherein the feedback loop is opened at startup of the optical TX when the optical TX is powered on.

14. The method of claim 13, wherein the OPCS algorithm causes a BW of the BW-S LPF to be set to a high BW at startup of the optical TX when the optical TX is powered on.

15. The method of claim 14, wherein after the BW of the BW-S LPF has been set to the high BW, the feedback loop is closed if the OPCS algorithm determines that the input data signal has the second status and is left open if the input data signal has the second status.

16. The method of claim 15, wherein if the feedback loop is closed, the feedback loop is allowed to settle to a steady state condition, wherein after the feedback loop has settled to the steady state condition, the OPCS algorithm checks whether the input data signal still has the second status, and if so, causes the BW of the BW-S LPF to be set to a low BW.

17. The method of claim 16, wherein after the feedback loop has settled to the steady state condition, the OPCS algorithm again determines whether the input data signal has the first or second status, wherein if the OPCS algorithm again determines that the input data signal has the second status, the OPCS algorithm causes the feedback loop to be kept closed.

18. The method of claim 17, wherein if, after the feedback loop is closed, the OPCS algorithm determines that the input data signal has the first status, the feedback loop is opened.

* * * * *